(12) United States Patent
Zhu et al.

(10) Patent No.: US 11,391,854 B2
(45) Date of Patent: Jul. 19, 2022

(54) OPTIMIZATION DESIGN METHOD FOR VOLUMETRIC FRACTURING CONSTRUCTION PARAMETERS OF INFILLED WELL OF UNCONVENTIONAL OIL AND GAS RESERVOIR

(71) Applicant: Chengdu University of Technology, Chengdu (CN)

(72) Inventors: Haiyan Zhu, Chengdu (CN); Jingen Deng, Chengdu (CN); Xuanhe Tang, Chengdu (CN)

(73) Assignee: CHENGDU UNIVERSITY OF TECHNOLOGY, Chengdu (CN)

( * ) Notice: Subject to any disclaimer, the term of this patent is extended or adjusted under 35 U.S.C. 154(b) by 277 days.

(21) Appl. No.: 16/580,936

(22) Filed: Sep. 24, 2019

(65) Prior Publication Data
US 2021/0003727 A1    Jan. 7, 2021

(30) Foreign Application Priority Data

Jul. 4, 2019   (CN) .......................... 201910599739.1

(51) Int. Cl.
| | |
|---|---|
| G06F 30/23 | (2020.01) |
| G01V 1/28 | (2006.01) |
| G01V 1/50 | (2006.01) |

(52) U.S. Cl.
CPC ............. *G01V 1/282* (2013.01); *G01V 1/50* (2013.01); *G06F 30/23* (2020.01); *G01V 2210/646* (2013.01); *G01V 2210/66* (2013.01)

(58) Field of Classification Search
CPC ............. G01V 1/50; G01V 2210/6169; G01V 2210/646; G01V 2210/6161;
(Continued)

(56) References Cited

U.S. PATENT DOCUMENTS 10,508,520 B2 * 12/2019 Saleh ................. E21B 43/168
10,920,552 B2 *  2/2021 Rodriguez Herrera ...................... G01V 1/288

(Continued)

FOREIGN PATENT DOCUMENTS

| CN | 106991236 A | 7/2017 |
| CN | 107066718 A | 8/2017 |

*Primary Examiner* — Kibrom K Gebresilassie
(74) *Attorney, Agent, or Firm* — Muncy, Geissler, Olds & Lowe, P.C.

(57) ABSTRACT

The present invention discloses an optimization design method for volumetric fracturing construction parameters of an infilled well of an unconventional oil and gas reservoir. The method comprises the following steps: S1, establishing a three-dimensional geological model with physical and geomechanical parameters; S2, establishing a natural fracture network model through integration of rock core-logging-seismic data; S3, generating old well hydraulic fracturing complex fractures based on the natural crack model; S4. establishing a three-dimensional shale gas reservoir seepage model; S5, establishing a three-dimensional geomechanical model; S6, analyzing and calculating a dynamic geostress field; S7, establishing a numerical model for horizontal fracturing complex fractures in the infilled well based on the calculation results of old well complex fractures and dynamic geostress; and S8, performing optimization design on volumetric fracturing construction parameters of the infilled well. The method of the present invention has the following beneficial effects: the effects of long-term exploitation of shale reservoirs in which natural fractures are developed on volumetric fracturing of the infilled well can be reflected accurately, the fracturing construction parameters are subjected to optimization design, the fracturing effect is improved effectively, and the single-well capacity is increased.

2 Claims, 8 Drawing Sheets

(58) Field of Classification Search
CPC ........... G01V 2210/6244; G01V 1/282; G01V 2210/663; G01V 2210/66; G06F 2111/10; G06F 30/23
See application file for complete search history.

(56) References Cited

U.S. PATENT DOCUMENTS

| | | | |
|---|---|---|---|
| 2013/0297272 A1* | 11/2013 | Sung | G01V 99/005 703/10 |
| 2013/0311158 A1* | 11/2013 | Dasari | G06F 30/20 703/10 |
| 2016/0090825 A1* | 3/2016 | Imhof | E21B 43/00 703/10 |
| 2017/0096887 A1* | 4/2017 | Wilson | G01V 3/38 |
| 2017/0205531 A1* | 7/2017 | Berard | E21B 7/04 |
| 2018/0113086 A1* | 4/2018 | Oliver | G01N 33/24 |
| 2018/0355707 A1* | 12/2018 | Rodriguez Herrera | G01V 1/50 |
| 2019/0345815 A1* | 11/2019 | Mishra | G01V 1/34 |
| 2021/0003727 A1* | 1/2021 | Zhu | E21B 49/00 |
| 2021/0003731 A1* | 1/2021 | Zhu | G01V 1/282 |

\* cited by examiner

OPTIMIZATION DESIGN METHOD FOR VOLUMETRIC FRACTURING CONSTRUCTION PARAMETERS OF INFILLED WELL OF UNCONVENTIONAL OIL AND GAS RESERVOIR

TECHNICAL FIELD

The present invention relates to the field of the development as well as production increase and transformation of oil and gas resources, in particular to an optimization design method for volumetric fracturing construction parameters of an infilled well of an unconventional oil and gas reservoir.

BACKGROUND

A horizontal well+segmented multi-cluster perforation+ large displacement volume fracturing technique is mainly adopted in high-efficiency development of shale gas resources in China to form a fracture network with higher flow conductivity, and to realize the volumetric reconstruction of a reservoir. After a period of exploitation, the single-well production rapidly decays. It is necessary to supplement block capacity by means of infilled well+hydraulic fracturing, so as to fully develop unused areas and improve the recovery efficiency. If the hydraulic fracturing effect of the infilled well is not good, the single-well capacity of the infilled well will be greatly limited, which will affect the overall recovery efficiency of a development block. At present, the key to solve this problem lies in whether high-efficiency fracturing construction parameters can be optimized by accurately understanding the current geomechanical characteristics of the reservoir.

By means of the conventional fracturing design of an infilled well, the current geostress around a well can be evaluated on the basis of rock core experiments, drilling, logging, leaking experiments and the like, the change conditions of the current geostress field can be speculated in combination with the initial geostress field in initial seismic or geological data, but it is impossible to consider the change in geostress in the long-term exploitation of a pre-production well into the overall geostress field of the reservoir, and further impossible to perform effective fracturing design of the infilled well with respect to the current reservoir stress state. On the other hand, it is often impossible for traditional dynamic geostress analysis (such as patent No: CN2017102173386, CN2017102173403) to consider the effects of a natural fracture network and pre-fracturing complex fractures of a reservoir, and the dynamic analysis results often differ greatly from the results of real reservoir pore pressure and geostress.

SUMMARY

An objective of the present invention is to overcome the defects of the prior art, and to provide an optimization design method which is capable of calculating volumetric fracturing construction parameters of an infilled well of a shale gas reservoir in which volumetric fracturing complex fractures are formed in the infilled well, in the case of simulating and analyzing the changes in geomechanical parameter fields in different production periods of the shale gas reservoir.

The objective of the present invention is implemented by the following technical solution: the optimization design method for volumetric fracturing construction parameters of an unconventional oil and gas reservoir includes the following steps:

S1, establishing a three-dimensional geological model with physical and geomechanical parameters, wherein layer information in the three-dimensional geological model should match a real formation layer, the physical parameters should include at least porosity, permeability, saturation and sedimentary facies, and the geomechanical parameters should include at least Young's modulus, Poisson's ratio, lithology, lithofacies and three-way geostress;

S2, identifying microscopic natural fracture parameters by rock core analysis, obtaining three-dimensional morphology and distribution of fractures around a well through the analysis of imaging logging data, obtaining the distribution of natural fractures in the reservoir through analysis of seismic interpretation results, and finally establishing a natural fracture network model through integration of rock core-logging-seismic data;

S3, embedding the natural fracture network model into the three-dimensional geological model, and calculating based on hydraulic fracturing design and construction data to generate hydraulic fracturing complex fractures in a pre-production well;

S4, embedding the hydraulic fracturing complex fractures in the pre-production well into the geological model with natural fractures, establishing a three-dimensional shale gas reservoir seepage model according to the three-dimensional geological model, and setting dynamic production parameter boundary conditions for each well;

S5, inversing the three-dimensional geological model to obtain geometric characteristics of the reservoir, establishing a mesh model according to analysis needs, and then assigning related attributes to the geomechanical mesh model by using the geomechanical attribute parameters corrected in the geological model to establish a three-dimensional geomechanical model;

S6, performing seepage-stress coupling dynamic calculation during shale gas reservoir exploitation on the basis of the shale gas reservoir seepage model and the geomechanical model by taking the dynamic production parameters of each well as boundary conditions, analyzing evolution conditions of a reservoir dynamic geomechanical parameter field, and updating the relevant geomechanical parameters in the original geological model with a complex fracture network according to the finally calculated current geomechanical parameter evolution results;

S7, on the basis of updating the complex fracture network geological model of the geomechanical parameters, establishing a numerical model for volumetric fracturing complex fractures in the infilled well in combination with volumetric fracturing design construction data of the infilled well; and S8, by changing different fracturing construction parameters in the numerical model for volumetric fracturing complex fractures in the infilled well, calculating to obtain different complex fracture distributions and configurations, analyzing the effects of different construction parameters on the volumetric fracturing transformation effect, and performing optimization design to obtain volumetric fracturing construction parameters of the infilled well by taking an optimal effective reservoir transformation volume as a goal.

Further, the dynamic geomechanical parameters and the current geomechanical parameters each include pore pressure and geostress.

The present invention has the following advantages:

(1) the shale reservoir gas reservoir model with a complex fracture network is established by reservoir natural fracture description and pre-fracturing complex fracture analysis, and the problem that only a simple fracturing fracture can be described in the traditional shale reservoir gas reservoir model, such that the dynamic change in pore pressure in the production process cannot be analyzed accurately is solved;

(2) by considering the dynamic production parameters, a four-dimensional dynamic geostress model of the shale reservoir is established to overcome the problem that the three-dimensional static geostress model cannot reflect the dynamic change in the geostress field during the long-term exploitation of the shale reservoir;

(3) the natural fracture state, the early hydraulic fracturing fracture state as well as the heterogeneity and anisotropy of pore elastic parameters of the shale reservoir can be described accurately, and the true state of the shale reservoir before fracturing of the infilled well is reflected to a greater extent;

(4) the problem of unclear understanding of the complex fracturing fracture morphology of the infilled well is solved by means of volumetric fracturing analysis of the infilled well developed on the basis of four-dimensional geostress results; and (5) the present invention proposes an optimization design method for volumetric fracturing construction parameters of the shale gas reservoir, and provides a theoretical basis for maximizing the effect of volumetric fracturing transformation of the infill well, which can increase the single-well capacity of the infilled well and improve the recovery efficiency of the reservoir.

DETAILED DESCRIPTION

The present invention will be further described below with reference to the accompanying drawings, but the protection scope of the present invention is not limited to the followings.

Figure 1:
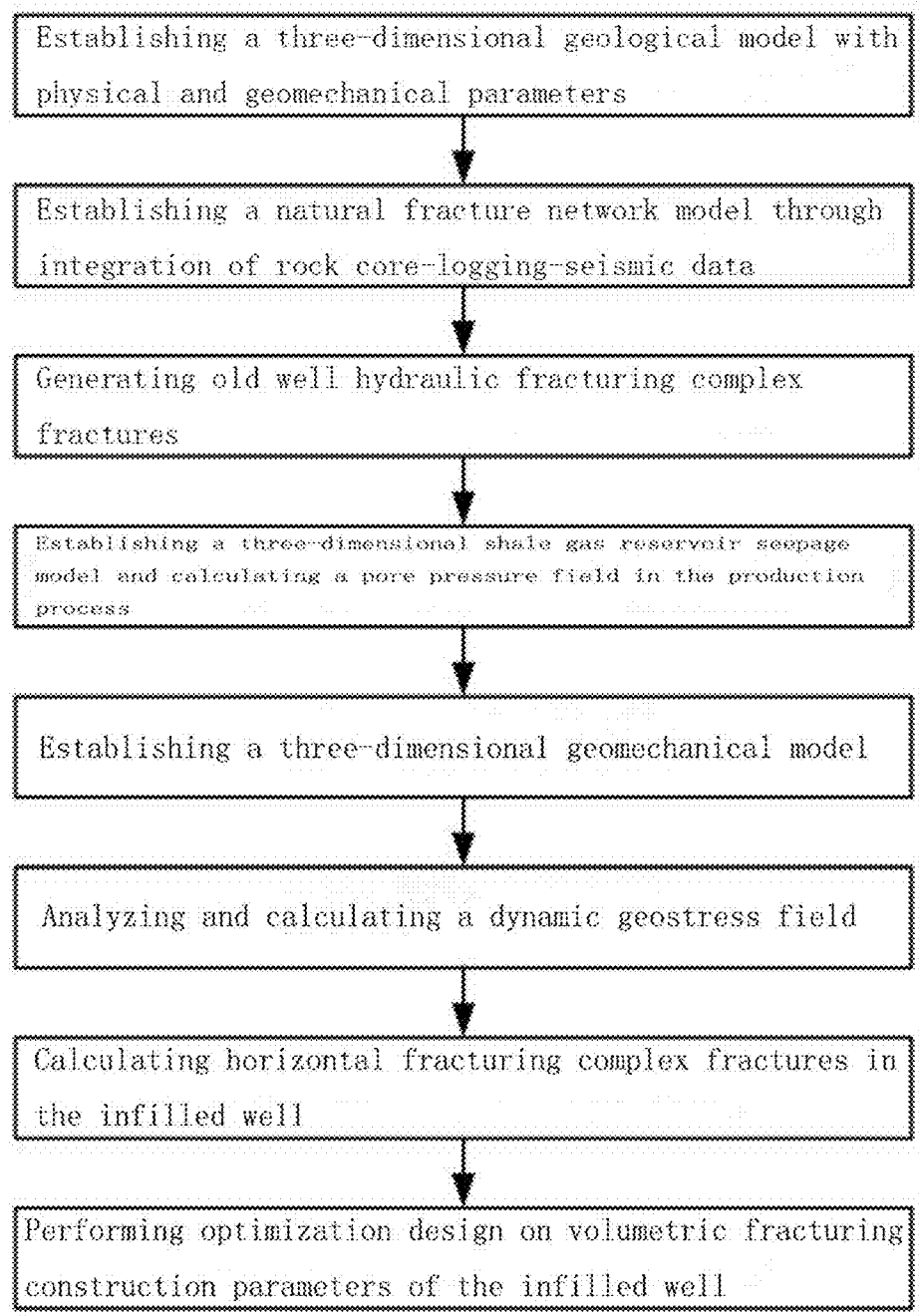
FIG. 1 is a flowchart of the present invention.
Figure 2:
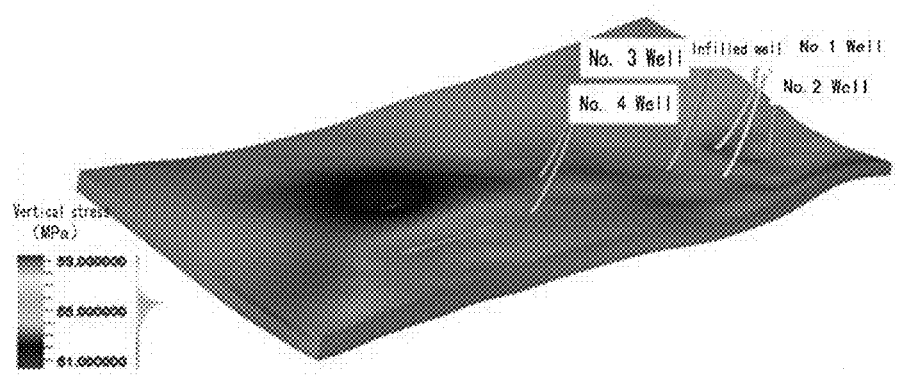
FIG. 2 is a diagram showing a geological property model.
Figure 3:
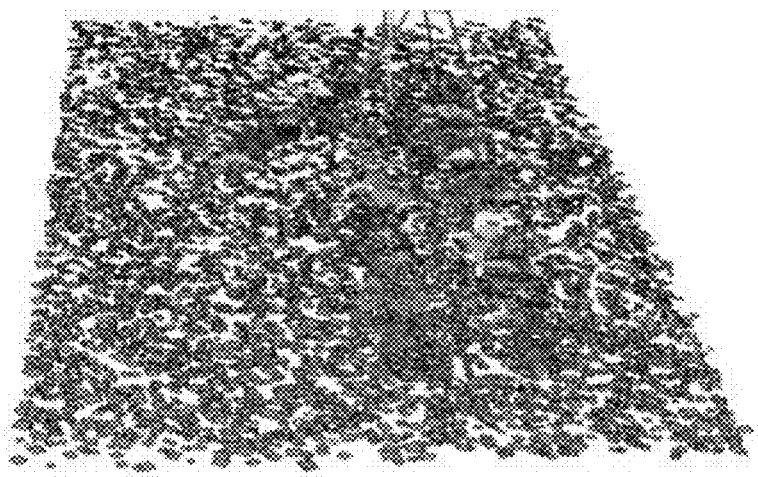
FIG. 3 is a diagram showing a reservoir natural fracture network model obtained by integrated rock core-logging-seismic data analysis.
Figure 4:
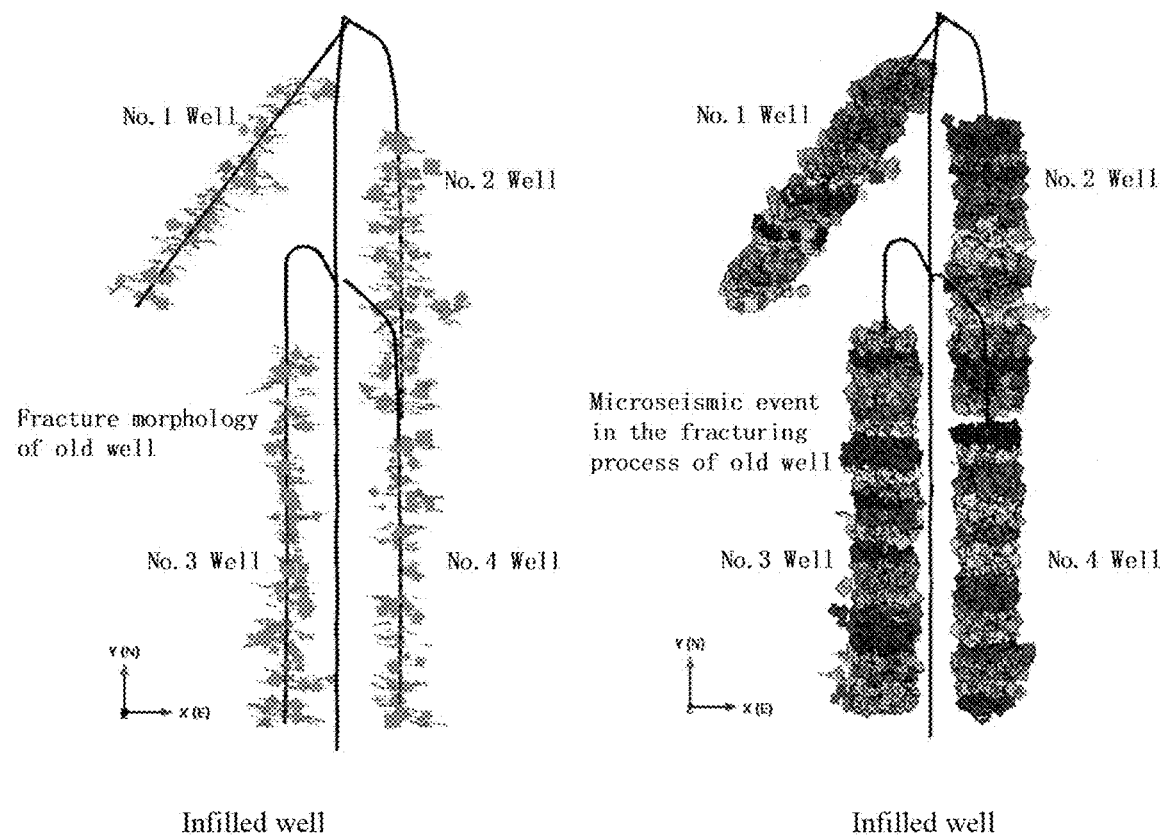
FIG. 4 is a comparison verification diagram of microseismic monitoring results of the pre-production well construction and simulation volumetric fracturing complex fractures.
Figure 5:
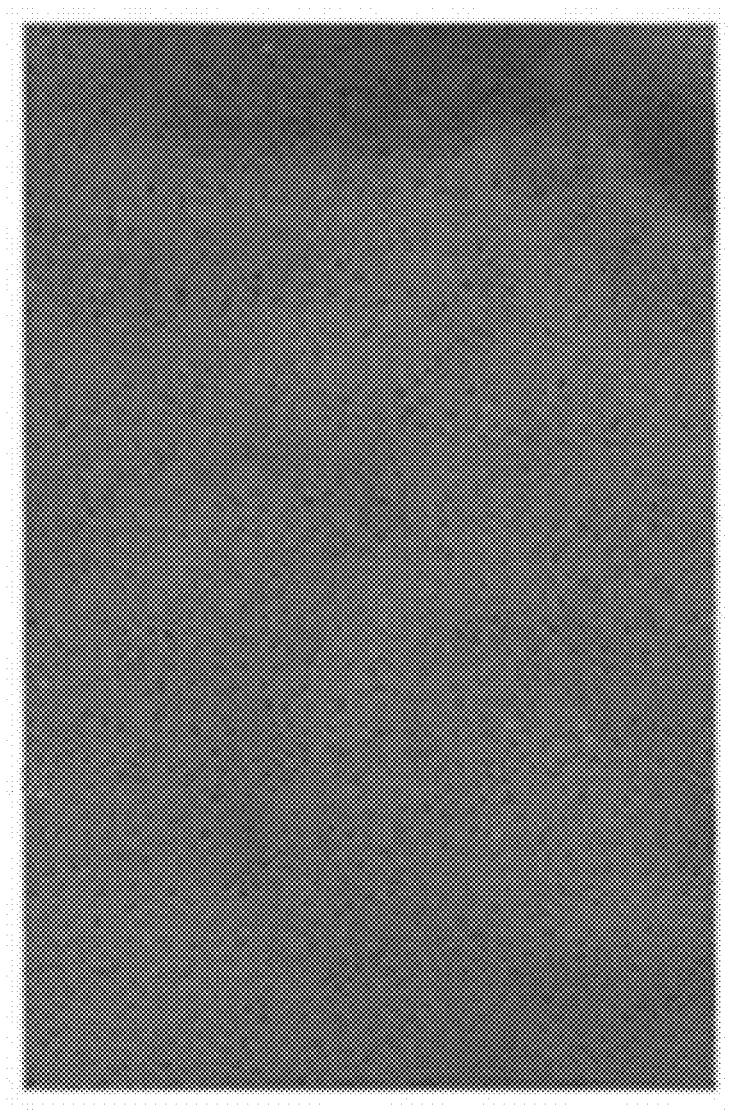
FIG. 5 is a diagram showing a shale gas reservoir model with a complex fracture network (natural fractures and hydraulic fractures in a pre-production well)
Figure 6:
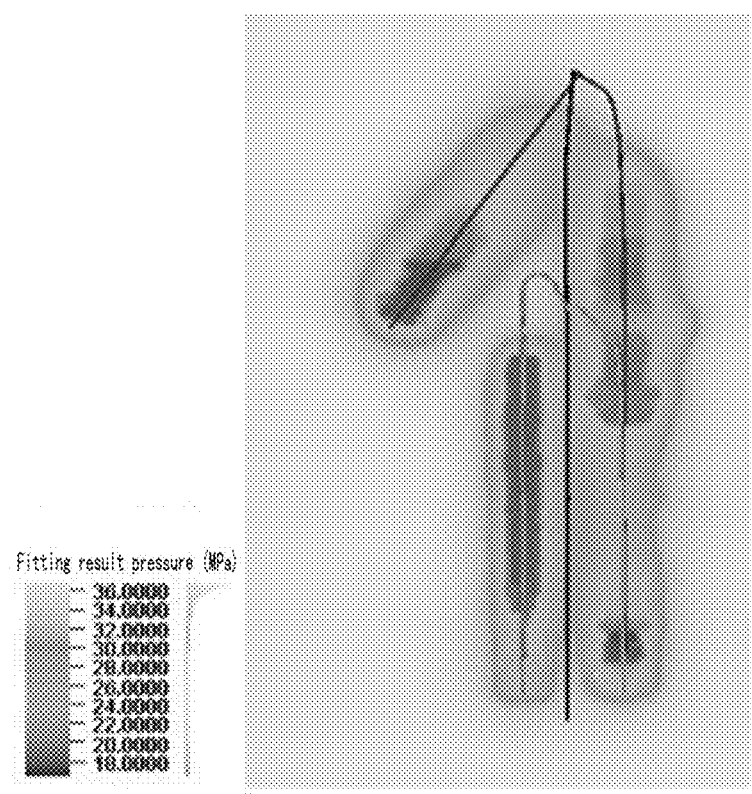
FIG. 6 is a diagram showing historic fitting results of the pore pressure before fracturing of an infilled well.
Figure 7:
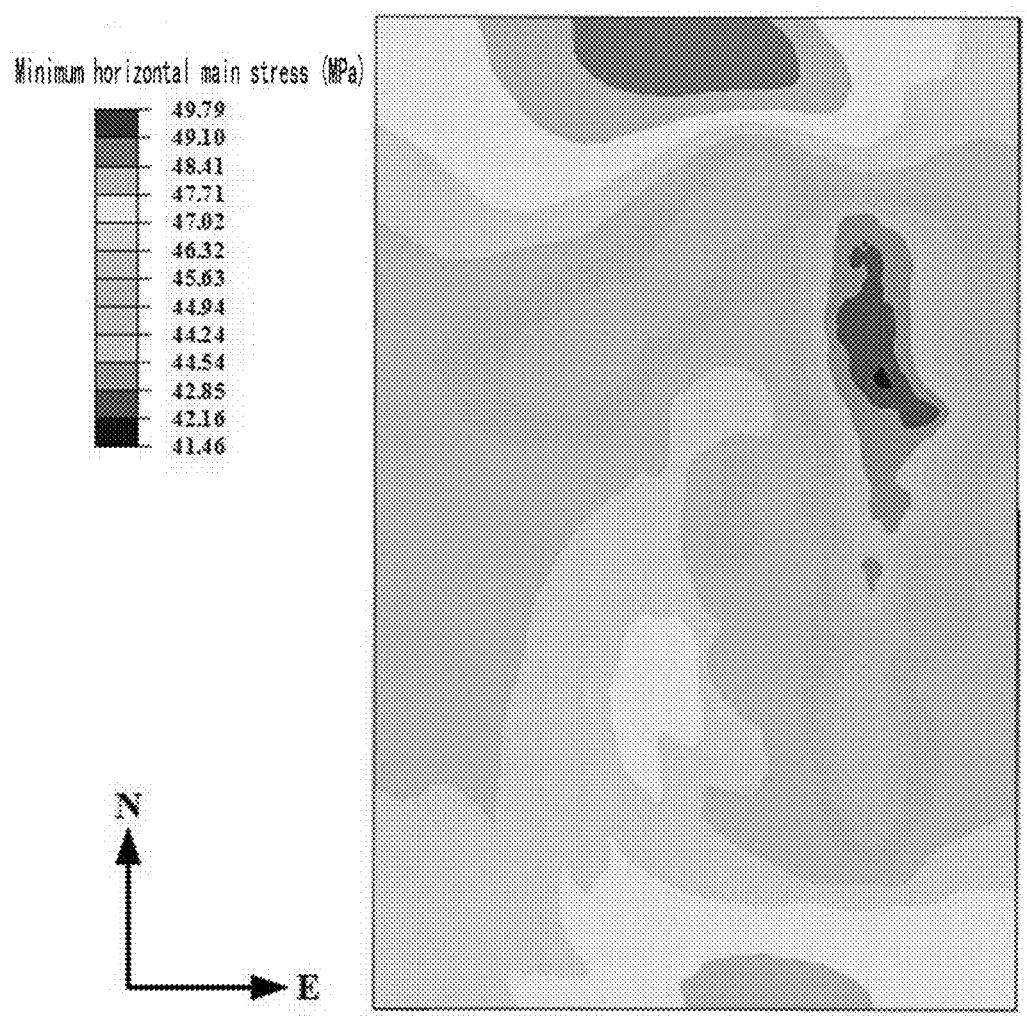
FIG. 7 is a diagram showing a minimum horizontal principal stress after exploitation.
Figure 8:
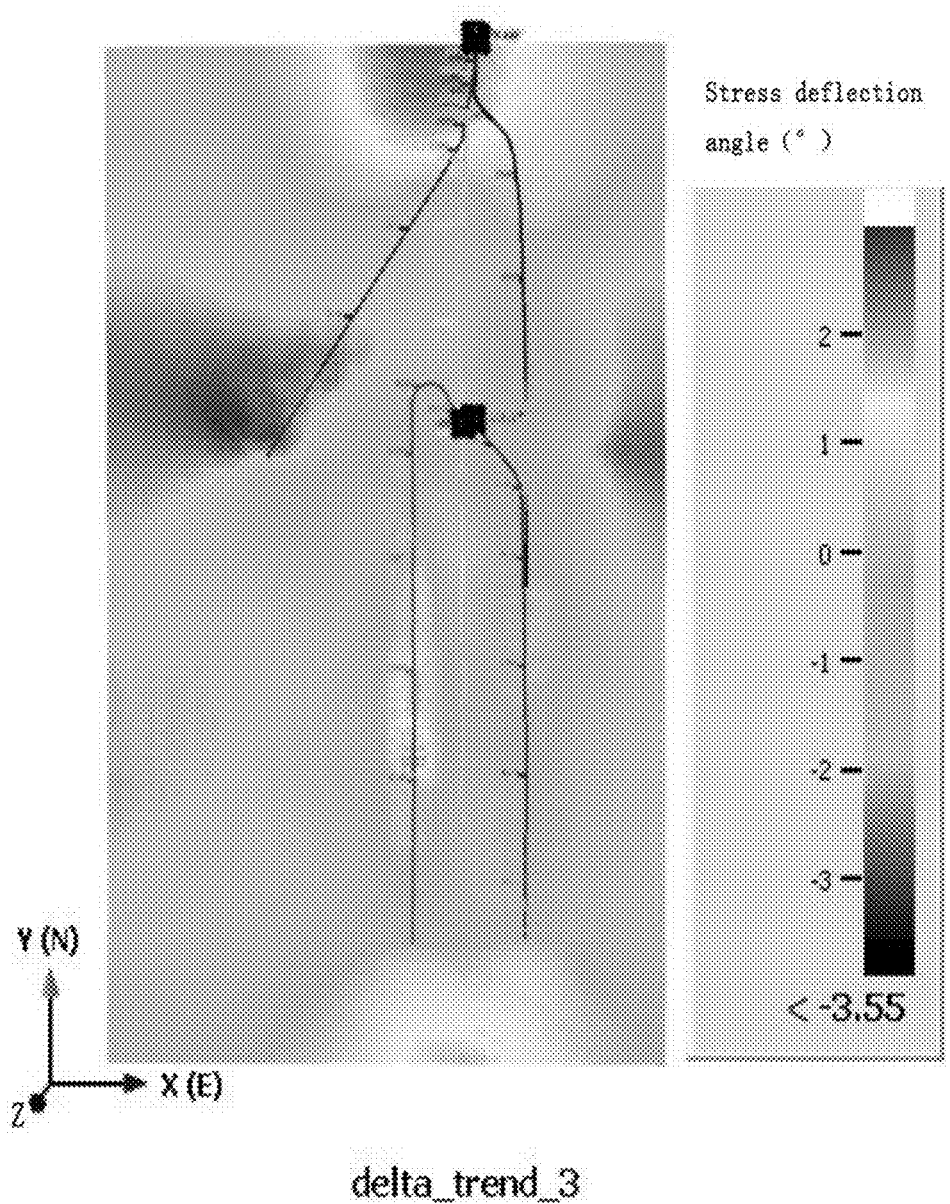
FIG. 8 is a diagram showing deflection angle distribution of the minimum horizontal principal stress.
Figure 9:
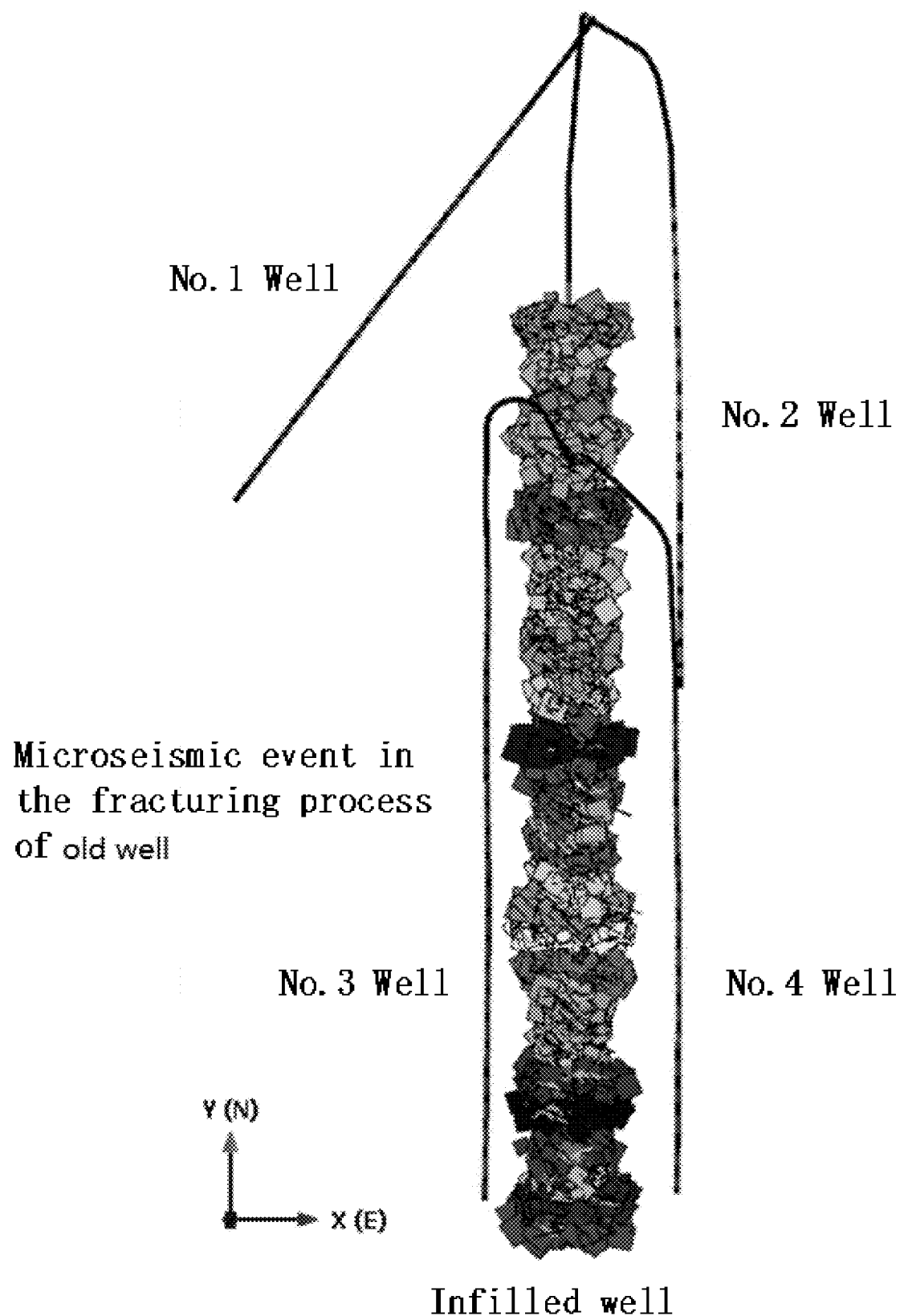
FIG. 9 is a diagram showing volumetric fracturing complex fractures calculated from the infilled well.

An optimization design method for volumetric fracturing construction parameters of an infilled well of an unconventional oil and gas reservoir comprises the following steps:

S1, establishing a three-dimensional geological model with physical and geomechanical parameters, wherein layer information in the three-dimensional geological model should match a real formation layer, the physical parameters should include at least porosity, permeability, saturation and sedimentary facies, and the geomechanical parameters should include at least Young's modulus, Poisson's ratio, lithology, lithofacies and three-way geostress;

the specific step of establishing the three-dimensional geological model includes: firstly, establishing a three-dimensional geological layer model of each small layer in the reservoir according to seismic data or geological atlas, and correcting the layer information by using single-well data in a block; then, dividing planar meshes according to the calculation accuracy requirement, and dividing the meshes with a small layer thickness in the longitudinal direction; next, performing interpretation on the reservoir layer in combination with single-well parameter profile data (including at least porosity, permeability, saturation, sedimentary facies, density, Young's modulus, Poisson's ratio, lithology, lithofacies and three-way geostress) corrected in an indoor rock core experiment; finally, performing three-dimensional interpolation on physical and geomechanical attribute parameters to generate a three-dimensional geological model; constraining the physical parameters such as porosity, permeability and saturation, and rock mechanical parameters such as Young's modulus and Poisson's ratio by using the sedimentary facies and lithofacies; performing interpolation by using a Gaussian random function model, and performing interpolation on three-way principal stress parameters by using a Kriging linear interpolation method, wherein the interpolation results are shown in FIG. 2;

S2, identifying microscopic natural fracture parameters by rock core analysis, obtaining three-dimensional morphology and distribution of fractures around a well through the analysis of imaging logging data, obtaining the distribution of natural fractures in the reservoir through analysis of seismic interpretation results, and finally establishing a natural fracture network model through integration of rock core-logging-seismic data. The specific establishing process comprises five steps:

S2(I) researching the distribution of multi-scale natural fractures in a rock core by rock core observation, logging data, sheet observation and scanning electron microscopy testing and analysis, and making statistics on the morphology, dimension and density parameters of micro-fractures;

S2(II) analyzing imaging logging data to obtain the three-dimensional distribution, dip angle, trend, spatial density and dimension of fractures around a well;

S2(III) analyzing seismic interpretation results to obtain the three-dimensional distribution of natural fractures in the reservoir, generating a natural fracture network in a three-dimensional space in combination with rock core analysis results and based on analysis results of fractures around the well, and distinguishing and making statistics on the dimension and distribution conditions of different types of natural fractures;

S2(IV) performing attribute assignment on fracture aperture and permeability parameters of three-dimensional fractures in combination with rock core-imaging logging analysis results in S2(I) and S2(II) and the dimension and distribution conditions of different types of natural fractures in S2(III); and S2(V) embedding the natural fracture network model into the meshes of the three-dimensional geological model, calculating fracture attributes of the natural fractures embedded in the meshes in combination with rock core-imaging logging analysis results (including different types of fracture apertures, permeability), calculating the equivalent permeability and porosity of the fracture meshes, and meanwhile, calculating a fracture shape factor by using a fracture spacing within a unit mesh in combination with the fracture density degree on the unit grid;

S3, embedding the natural fracture network model into the three-dimensional geological model, and calculating based on hydraulic fracturing design and construction data to generate hydraulic fracturing complex fractures in a pre-production well. The specific calculation process includes the following four steps:

S3(I) analyzing and making statistics on the design and construction parameters of the pre-fracturing well in a block under study, including fracturing interval, perforation interval, perforation cluster length, fracturing fluid volume, pump pressure, and the displacement;

S3(II) setting fracturing segmentation data and perforation data in each pre-production well of the block under study, and entering an actual pumping procedure and construction parameters;

S3(III) performing fitting calculation on the volumetric fracturing complex fractures of the pre-production well in a three-dimensional geological model with a natural fracture network to finally form a three-dimensional geological model with a complex fracture network, as shown in FIG. 3, and analyzing the volumetric fracturing complex fracture morphology and the effect of natural fractures on the formation of complex fractures; and S3 (IV) performing comparison verification on the volumetric fracturing complex fractures by using microseismic monitoring results, as shown in FIG. 4;

S4, embedding the hydraulic fracturing complex fractures in the pre-production well into the geological model with natural fractures, establishing a three-dimensional shale gas reservoir model according to the three-dimensional geological model, and setting dynamic production parameter boundary conditions for each well. The specific calculation process comprises the following three steps:

S4(I) introducing a three-dimensional geological model with a complex fracture network (including natural fractures and hydraulic fracturing) into an oil reservoir simulator, as shown in FIG. 5, establishing a three-dimensional shale gas reservoir model with finite difference meshes, and considering physical properties of a reservoir matrix, complex fracture permeability anisotropy, porosity, and fracture shape factor properties in the model;

S4(II) establishing a dual-hole seepage mechanism in a three-dimensional shale gas reservoir model, setting a shale desorption model and a phase infiltration model according to indoor rock core experiment results, and establishing a vertical pipe flow model based on the results of the well testing analysis; and S4 (III) setting the boundary conditions for each production well, and constraining each well according to production dynamic data (including wellhead flow, wellhead pressure, bottom hole pressure and bottom hole flow) of each well within a certain time (the specified certain time can be determined according to the actual needs of on-site engineering, and refers to different times during the time period of production for several days or months or years) to form a complete three-dimensional numerical model of shale gas reservoir seepage, as shown in FIG. 6;

S5, inversing the three-dimensional geological model to obtain geometric characteristics of the reservoir, establishing a mesh model according to analysis needs, then assigning related attributes to the geomechanical mesh model by using the geomechanical attribute parameters corrected by the geological model to establish a four-dimensional geomechanical model. The specific establishing process comprises the following four steps:

S5(I) inverting the reservoir geometry information of a block under study according to node parameters of the geological model, and establishing a geometric entity;

S5(II) selecting an element type according to the stratification of the reservoir and dividing meshes to establish a finite element geomechanical mesh model;

S5(III) compiling a three-dimensional search interpolation program, and interpolating the attributes in the three-dimensional geological model into the finite element geomechanical mesh model to establish a four-dimensional isotropic geomechanical model; and S5(IV) establishing a shale transverse isotropic geomechanical model in combination with anisotropy and stress sensitivity parameters;

S6, performing seepage-stress coupling dynamic calculation during shale gas reservoir exploitation on the basis of the shale gas reservoir seepage model and the geomechanical model by taking the dynamic production parameters of each well as boundary conditions, analyzing evolution conditions of a reservoir dynamic geomechanical parameter field, and updating the relevant geomechanical parameters in the original geological model with a complex fracture network according to the finally calculated current geomechanical parameter evolution results, as shown in FIG. 7 and FIG. 8. The specific calculation process comprises the following five steps:

S6 (I) setting a calculation time step (in days or months or years) first, and performing shale gas reservoir seepage history fitting to obtain the pore pressure change under the current time step;

S6(II) introducing the calculated pore pressure change in the seepage model into the geomechanical model;

S6 (III) carrying out geomechanical dynamic calculation with the pore pressure as the boundary condition to obtain the change in petrophysical parameters;

S6(IV) introducing the change in petrophysical parameters into the seepage model; and S6(V) carrying out shale gas reservoir seepage history fitting under the next time step;

S7, updating the relevant geomechanical parameters in the original geological model with a complex fracture network according to the dynamic geomechanical parameter evolution results, and on this basis, establishing a numerical model for volumetric fracturing complex fractures in the infilled well in combination with volumetric fracturing design construction data of the infilled well, wherein the specific calculation process comprises the following five steps:

S7(I) interpolating the dynamic geomechanical parameter evolution results calculated by the finite element model into the original geological model with a complex fracture network, and updating the relevant geomechanical parameters;

S7(II) establishing a numerical model for complex fracture fitting of volumetric fracturing in the infilled well by using the updated geological model;

S7(III) constraining each well in the numerical model with the design or construction data (including trajectory, perforation, fracturing) of volumetric fracturing in the infilled well to form a complete numerical model of the volumetric fracturing complex fractures of the infilled well;

S7 (IV) carrying out numerical fitting of complex fractures by using the numerical model, as shown in FIG. 9; and S7(V) performing comparison verification on the volumetric fracturing complex fractures by using microseismic monitoring results, comparing the comparison verification result with the current three-dimensional geostress field, and analyzing the exploitation effect of the pre-production well on the fracturing fracture morphology of the infilled well;

S8. by changing the different fracturing construction parameters (including perforation cluster spacing, segment spacing, pump pressure, displacement, fracturing fluid viscosity), simulating complex fracture parameters of volumetric fracturing in the infilled well according to the method described in S7(IV), calculating complex fracture parameters under different construction parameters, calculating an effective reservoir modification volume of a single-stage fracture (i.e., the reservoir transformation volume calculated by a hydraulic expansion joint), comparing to obtain construction parameters of the optimal effective reservoir transformation volume with respect to profit, and finally performing optimization design to obtain a full set of volumetric fracturing construction parameters.

The dynamic geomechanical parameters and the current geomechanical parameters each include pore pressure and geostress.

This optimization design method can describe the natural fracture distribution and parameters of a shale reservoir, and based on this, fit fracture parameters of volumetric fracturing of the pre-production well to further simulate and analyze the changes in geostress and geomechanical parameters at different positions within different production times. On this basis, the complex fractures of volumetric fracturing in the infilled well are calculated by fitting, and the true dynamic changes of the shale reservoir in the pre-fracturing, production, and infilled well fracturing processes are reflected to a greater extent. Meanwhile, a series of key technical problems in fracturing of the infilled well in the shale gas reservoir are solved, i.e., the accuracy of the natural fracture network described in the traditional geomechanical model is low, the fracturing fractures of the pre-production well cannot be accurately reflected in the shale reservoir seepage, the three-dimensional static geostress model cannot accurately reflect the changes in geostress and reservoir parameters during shale gas reservoir generation, and infilled well fracturing analysis cannot be based on the true geomechanical state and a method for optimizing infilled well fracturing construction parameters for an optimal effective reservoir transformation volume as an object.

The above content only refers to embodiment for model establishment of the present invention, and it should be understood that the present invention is not limited to the forms disclosed herein, and should not be construed as being excluded from other embodiments, but may be used in various other combinations, modifications, and environments, and can be modified according to the above teachings or related art or knowledge within the scope of the concepts described herein. However, all changes and modifications made by those skilled in the art without departing from the spirit and scope of the present invention should fall within the protection scope of claims of the present invention.

The invention claimed is:

1. An optimization design method for volumetric fracturing construction parameters of an infilled well of an unconventional oil and gas reservoir, comprising the following steps:
   S1, establishing a three-dimensional geological model with physical and geomechanical parameters, wherein layer information in the three-dimensional geological model should match a real formation layer, the physical parameters should include at least porosity, permeability, saturation and sedimentary facies, and the geomechanical parameters should include at least Young's modulus, Poisson's ratio, lithology, lithofacies and three-way geostress;
   S2, identifying microscopic natural fracture parameters by rock core analysis, obtaining three-dimensional morphology and distribution of fractures around a well through analysis of imaging logging data, obtaining the distribution of natural fractures in the reservoir through analysis of seismic interpretation results, and establishing a natural fracture network model finally through integration of rock core-logging-seismic data;
   S3, embedding the natural fracture network model into the three-dimensional geological model, and calculating based on hydraulic fracturing design and construction data to generate hydraulic fracturing complex fractures in a pre-production well;
   S4, embedding the hydraulic fracturing complex fractures in the pre-production well into the geological model with natural fractures, establishing a three-dimensional shale gas reservoir seepage model according to the three-dimensional geological model, and setting dynamic production parameter boundary conditions for each well;
   S5, inversing the three-dimensional geological model to obtain geometric characteristics of the reservoir, establishing a mesh model, and then assigning related attributes to the geomechanical mesh model by using geomechanical attribute parameters corrected in the geological model to establish a three-dimensional geomechanical model;
   S6, performing seepage-stress coupling dynamic calculation during shale gas reservoir exploitation on the basis of the shale gas reservoir seepage model and the geomechanical model by taking the dynamic production parameters of each well as boundary conditions, analyzing evolution conditions of a reservoir dynamic geomechanical parameter field, and updating the relevant geomechanical parameters in the original geological model with a complex fracture network according to the finally calculated current geomechanical parameter evolution results;
   S7, on the basis of updating the complex fracture network geological model of the geomechanical parameters, establishing a numerical model for volumetric fracturing complex fractures in the infilled well in combination with volumetric fracturing design construction data of the infilled well; and
   S8, by changing different fracturing construction parameters in the numerical model for volumetric fracturing complex fractures in the infilled well, calculating to obtain different complex fracture distributions and configurations, analyzing effects of different construction parameters on the volumetric fracturing transformation effect, and performing optimization design to obtain volumetric fracturing construction parameters of the infilled well by taking an optimal effective reservoir transformation volume as a goal,
   wherein the step S1 further comprises:
   establishing a three-dimensional geological layer model of each small layer in the reservoir according to seismic data or geological atlas, and correcting the layer information by using single-well data in a block;
   dividing planar meshes, and dividing the meshes with a small layer thickness in the longitudinal direction;
   performing interpretation on a reservoir layer in combination with single-well parameter profile data corrected in an indoor rock core experiment;
   performing three-dimensional interpolation on physical and geomechanical attribute parameters to generate a three-dimensional geological model;

constraining the physical parameters comprising porosity, permeability and saturation, and rock mechanical parameters comprising Young's modulus and Poisson's ratio by using the sedimentary facies and lithofacies; and performing interpolation by using a Gaussian random function model, and performing interpolation on three-way principal stress parameters by using a Kriging linear interpolation method.

2. The optimization design method for volumetric fracturing construction parameters of the infilled well of the unconventional oil and gas reservoir according to claim 1, wherein the dynamic geomechanical parameters and the current geomechanical parameters each include pore pressure and geostress.

\* \* \* \* \*